US012575119B2

(12) United States Patent
Park et al.

(10) Patent No.: US 12,575,119 B2
(45) Date of Patent: Mar. 10, 2026

(54) SEMICONDUCTOR DEVICE

(71) Applicant: SAMSUNG ELECTRONICS CO., LTD., Suwon-si (KR)

(72) Inventors: Jungmin Park, Seoul (KR); Hanjin Lim, Seoul (KR); Hyungsuk Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 508 days.

(21) Appl. No.: 18/050,967

(22) Filed: Oct. 28, 2022

(65) Prior Publication Data

US 2023/0290810 A1 Sep. 14, 2023

(30) Foreign Application Priority Data

Mar. 11, 2022 (KR) ........................ 10-2022-0030547

(51) Int. Cl.
|  |  |
|---|---|
| *H10D 1/68* | (2025.01) |
| *H10B 53/10* | (2023.01) |
| *H10B 53/30* | (2023.01) |

(52) U.S. Cl.
CPC ............. *H10D 1/684* (2025.01); *H10B 53/10* (2023.02); *H10B 53/30* (2023.02)

(58) Field of Classification Search
CPC ......... H10D 1/684; H10B 53/30; H10B 53/10
See application file for complete search history.

(56) References Cited

U.S. PATENT DOCUMENTS

| | | |
|---|---|---|
| 6,496,878 B1 | 12/2002 | Hayashi et al. |
| 9,053,802 B2 | 6/2015 | Muller et al. |
| 10,833,091 B2 | 11/2020 | Lin et al. |
| 11,101,362 B2 | 8/2021 | Chen et al. |
| 11,522,082 B2 | 12/2022 | Heo et al. |
| 2005/0219769 A1 | 10/2005 | Shimura et al. |
| 2018/0233573 A1 | 8/2018 | Lin et al. |
| 2020/0286984 A1 | 9/2020 | Chang et al. |
| 2021/0359082 A1 | 11/2021 | Kang |
| 2021/0359100 A1 | 11/2021 | Maeng et al. |
| 2021/0359101 A1 | 11/2021 | Heo et al. |
| 2022/0093603 A1 | 3/2022 | Cho et al. |

(Continued)

FOREIGN PATENT DOCUMENTS

| | | |
|---|---|---|
| CN | 112531029 | 3/2021 |
| CN | 113213923 | 8/2021 |

(Continued)

*Primary Examiner* — Richard A Booth
(74) *Attorney, Agent, or Firm* — Morgan, Lewis & Bockius LLP

(57) ABSTRACT

A semiconductor device includes a capacitor structure. The capacitor structure includes a bottom electrode, a dielectric layer, and a top electrode that are sequentially stacked in a first direction. The dielectric layer includes first dielectric layers and second dielectric layers interposed between the bottom electrode and the top electrode and are that are alternately stacked in the first direction. The first dielectric layers include a ferroelectric material, and the second dielectric layers include an anti-ferroelectric material. A lowermost second dielectric layer is interposed between a lowermost first dielectric layer and the bottom electrode, and an uppermost second dielectric layer is interposed between an uppermost first dielectric layer and the top electrode.

20 Claims, 12 Drawing Sheets

CAP

(56)                    References Cited

U.S. PATENT DOCUMENTS

| | | | |
|---|---|---|---|
| 2022/0416055 A1* | 12/2022 | Maeng ................ | H10D 64/685 |
| 2022/0416065 A1 | 12/2022 | Maeng et al. | |
| 2023/0163160 A1* | 5/2023 | Park ..................... | H10D 1/694 |
| | | | 257/298 |

FOREIGN PATENT DOCUMENTS

| | | |
|---|---|---|
| CN | 113690226 | 11/2021 |
| JP | 3138128 B2 | 2/2001 |
| KR | 10-2020-0115693 A | 10/2020 |
| KR | 10-2021-0142356 A | 11/2021 |

* cited by examiner

SEMICONDUCTOR DEVICE

CROSS-REFERENCE TO RELATED APPLICATIONS

This U.S. non-provisional patent application claims priority under 35 U.S.C. § 119 from Korean Patent Application No. 10-2022-0030547, filed on Mar. 11, 2022 in the Korean Intellectual Property Office, the contents of which are herein incorporated by reference in their entirety.

TECHNICAL FIELD

Embodiments of the present disclosure are directed to a semiconductor device, and in particular, to a semiconductor memory device.

DISCUSSION OF THE RELATED ART semiconductor devices are classified into semiconductor memory devices that store data, semiconductor logic devices that process data, and hybrid semiconductor devices that include both of memory and logic elements.

As integration densities of the semiconductor devices increase a capacitor is needed that has a sufficiently high capacitance in a limited area. The electrostatic capacitance of the capacitor is proportional to a surface area of an electrode and a dielectric constant of a dielectric layer and is inversely proportional to an equivalent oxide thickness of the dielectric layer.

SUMMARY

An embodiment of the inventive concept provides a semiconductor device with increased electric and reliability characteristics.

According to an embodiment of the inventive concept, a semiconductor device includes a capacitor structure. The capacitor structure includes a bottom electrode, a dielectric layer, and a top electrode that are sequentially stacked in a first direction. The dielectric layer includes first dielectric layers and second dielectric layers interposed between the bottom electrode and the top electrode and that are alternately stacked in the first direction. The first dielectric layers include a ferroelectric material, and the second dielectric layers include an anti-ferroelectric material. A lowermost second dielectric layer is interposed between a lowermost first dielectric layer and the bottom electrode, and an uppermost second dielectric layer is interposed between an uppermost first dielectric layer and the top electrode.

According to an embodiment of the inventive concept, a semiconductor device includes a capacitor structure. The capacitor structure includes a bottom electrode, a dielectric layer, and a top electrode that are alternately stacked in a first direction. The dielectric layer includes first dielectric layers and second dielectric layers interposed between the bottom electrode and the top electrode and that are alternately stacked in the first direction. The first dielectric layers include a ferroelectric material, and the second dielectric layers include an anti-ferroelectric material. A lowermost second dielectric layer is in contact with the bottom electrode, and an uppermost second dielectric layer is in contact with the top electrode. The first dielectric layers are interposed between the uppermost and the lowermost second dielectric layers.

According to an embodiment of the inventive concept, a semiconductor device includes a substrate, bottom electrodes disposed on the substrate and that are horizontally spaced apart from each other, a top electrode that covers the bottom electrodes, and a dielectric layer interposed between each of the bottom electrodes and the top electrode. The dielectric layer includes first dielectric layers and second dielectric layers that are alternately stacked in a direction perpendicular to an interface between each of the bottom electrodes and the top electrode. The first dielectric layers include a ferroelectric material, and the second dielectric layers include an anti-ferroelectric material. A lowermost second dielectric layer is interposed between a lowermost first dielectric layer and each of the bottom electrodes, and an uppermost second dielectric layer is interposed between an uppermost first dielectric layer and the top electrode.

DETAILED DESCRIPTION

Figure 1:
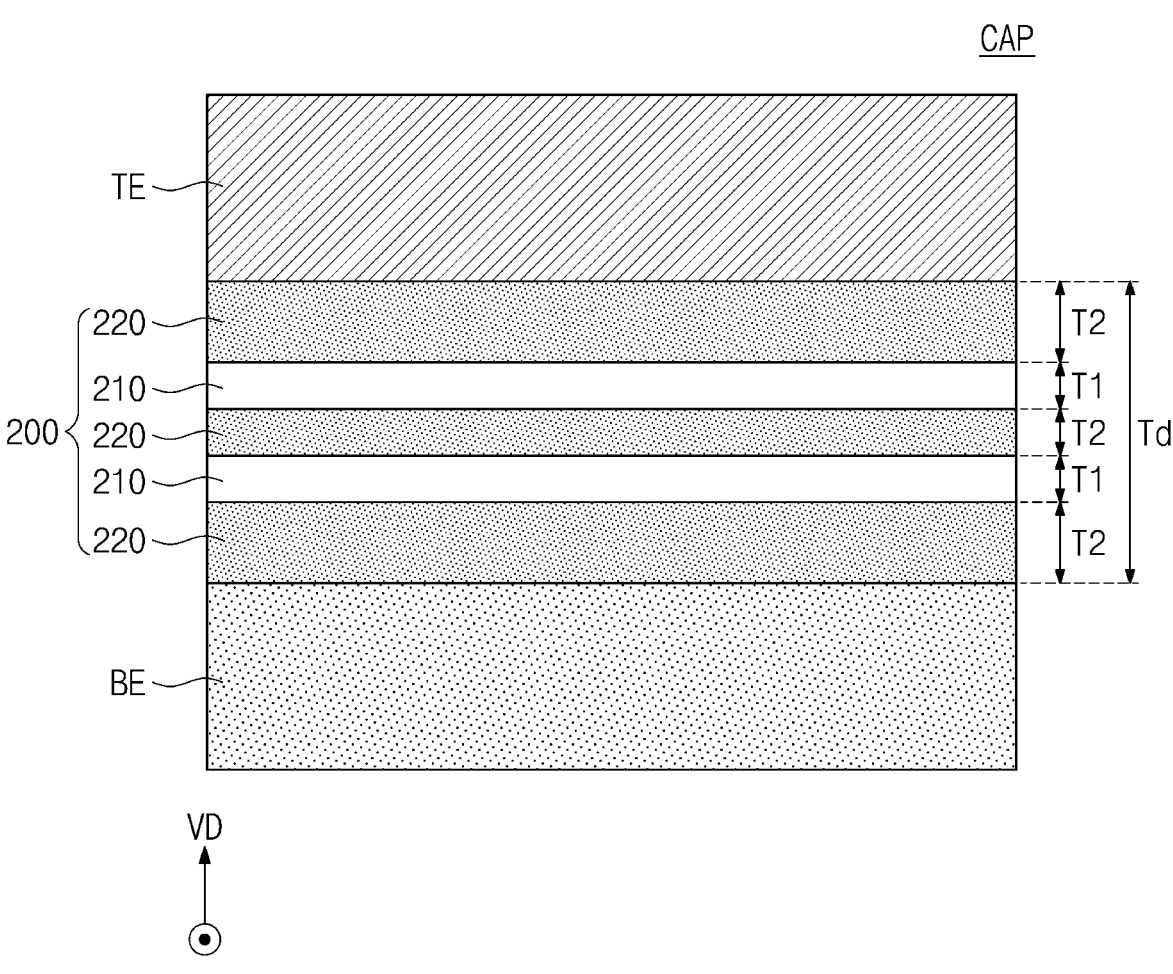
FIGS. 1 to 3 are sectional views of a capacitor structure of a semiconductor device according to an embodiment of the inventive concept.
Figure 2:
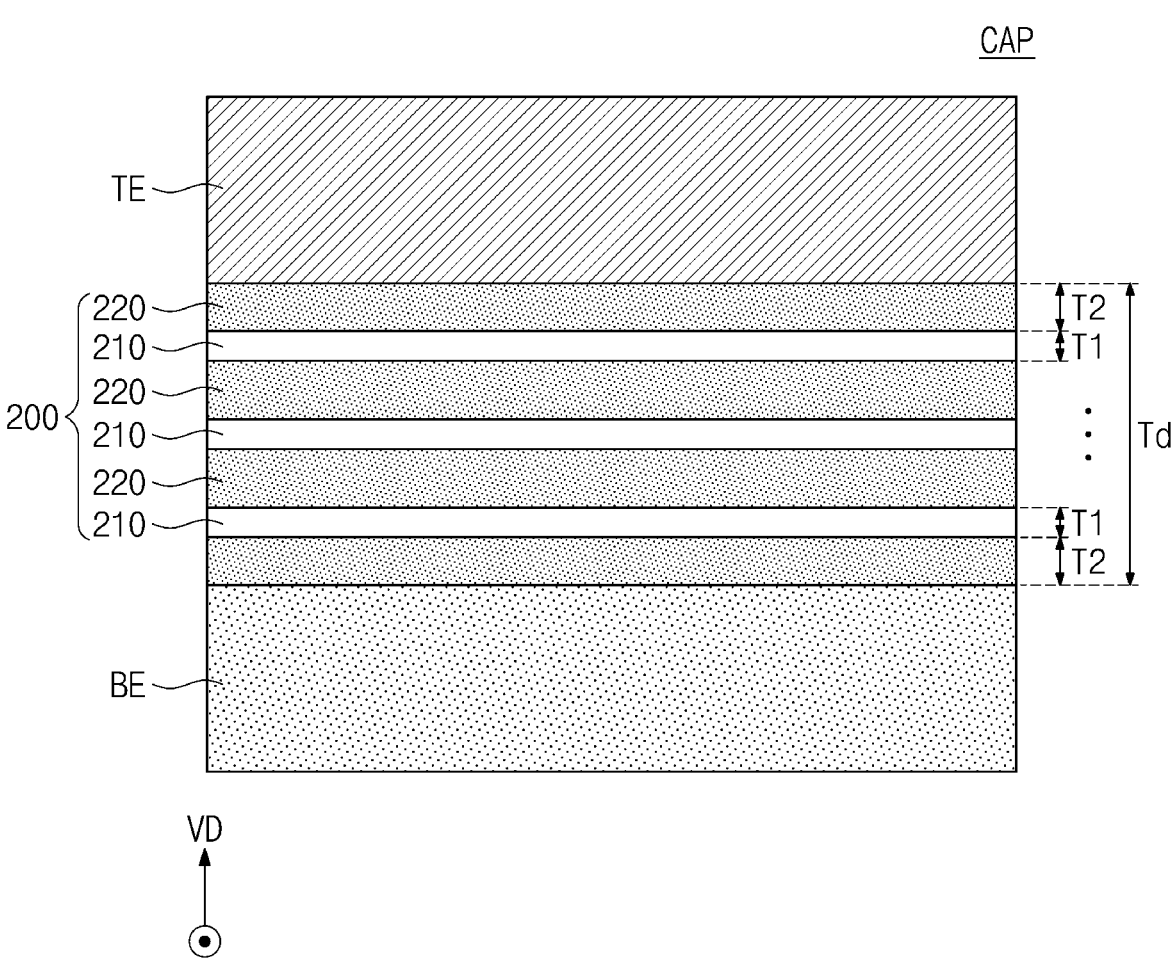
Figure 3:
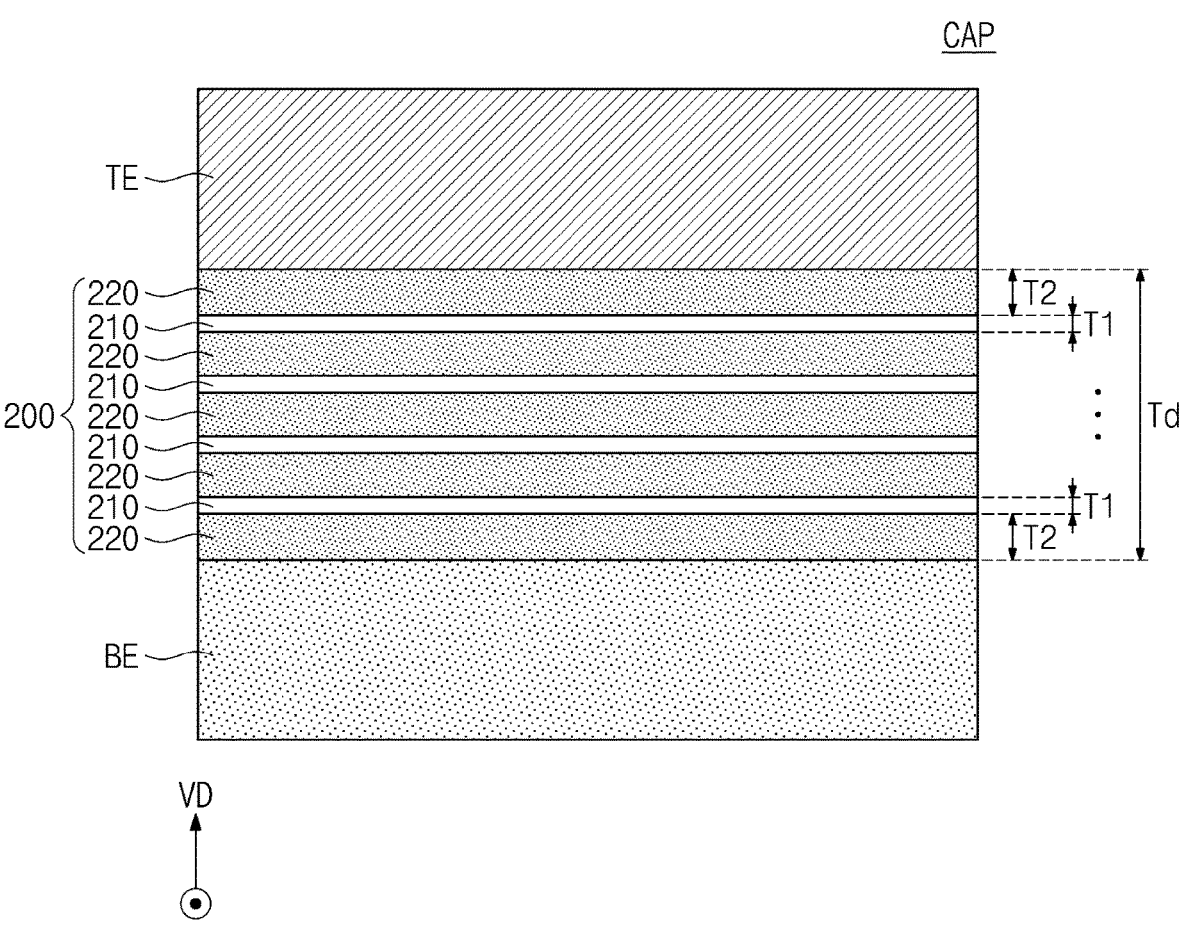

FIGS. 1 to 3 are sectional views of a capacitor structure of a semiconductor device according to an embodiment of the inventive concept.

Referring to FIGS. 1 to 3, in some embodiments, a semiconductor device includes a capacitor structure CAP, and the capacitor structure CAP includes a bottom electrode BE, a dielectric layer 200, and a top electrode TE that are sequentially stacked in a direction VD. The direction VD is perpendicular to an interface between the bottom electrode BE and the top electrode TE, and the dielectric layer 200 is interposed between the bottom electrode BE and the top electrode TE.

The dielectric layer 200 includes first dielectric layers 210 and second dielectric layers 220 that are provided between the bottom electrode BE and the top electrode TE and are alternately stacked in the direction VD. The lowermost second dielectric layer 220 is in contact with the bottom electrode BE and is interposed between the lowermost first dielectric layer 210 and the bottom electrode BE. The lowermost first dielectric layer 210 is spaced apart from the bottom electrode BE by the lowermost second dielectric layer 220. The uppermost second dielectric layer 220 is in contact with the top electrode TE and is interposed between the uppermost first dielectric layer 210 and the top electrode TE. The uppermost first dielectric layer 210 is spaced apart from the top electrode TE by the uppermost second dielectric layer 220. The first dielectric layers 210 are interposed between the uppermost second dielectric layer 220 and the lowermost second dielectric layer 220.

The number of layers of the first and second dielectric layers 210 and 220 can vary, and in an embodiment, the number of layers of the second dielectric layers 220 is greater than the number of layers number of the first dielectric layers 210. For example, as shown in FIG. 1, the first dielectric layers 210 includes two layers, and the second dielectric layers 220 includes three layers. In an embodiment, as shown in FIG. 2, the first dielectric layers 210 include three layers, and the second dielectric layers 220 include four layers. In an embodiment, as shown in FIG. 3, the first dielectric layers 210 includes four layers, and the second dielectric layers 220 includes five layers. However, embodiments of the inventive concept are not necessarily limited to these examples.

Each of the first dielectric layers 210 includes a ferro-electricity material. In an embodiment, each of the first dielectric layers 210 includes at least one of hafnium oxide (e.g., $HfO_2$) or hafnium-zirconium oxide (e.g., $Hf_{0.5}Zr_{0.5}O_2$), but embodiments of the inventive concept are not necessarily limited to such materials. The second dielectric layers 220 include an anti-ferroelectric material or a material that has an electric field-induced phase transition property.

For example, each of the second dielectric layers 220 includes at least one of zirconium oxide (e.g., $ZrO_2$) or hafnium-zirconium oxide (e.g., $HfZrO_2$), but embodiments of the inventive concept are not necessarily limited to such materials. The dielectric layer 200 includes at least one of hafnium oxide (e.g., $HfO_2$), zirconium oxide (e.g., $ZrO_2$), titanium oxide (e.g., $TiO_2$), tantalum oxide (e.g., $Ta_2O_3$), vanadium oxide (e.g., $VO_2$), aluminum oxide (e.g., $AlO_2$), silicon oxide (e.g., $SiO_2$), or hafnium-zirconium oxide (e.g., $HfZrO_2$), but embodiments of the inventive concept are not necessarily limited to such materials.

Each of the first dielectric layers 210 has a thickness T1 in the direction VD, and each of the second dielectric layers 220 has a thickness T2 in the direction VD. The thicknesses T1 of the first dielectric layers 210 may be equal to or different from each other, and the thicknesses T2 of the second dielectric layers 220 may be equal to or different from each other. A sum of the thicknesses T1 of the first dielectric layers 210 is less than a sum of the thicknesses T2 of the second dielectric layers 220. In an embodiment, the sum of the thicknesses T1 of the first dielectric layers 210 has a non-vanishing value that is less than 30% of a total thickness Td of the dielectric layer 200, and the sum of the thicknesses T2 of the second dielectric layers 220 is greater than 70% of the total thickness Td and less than the total thickness Td. In an embodiment, the total thickness Td of the dielectric layer 200 is greater than 0 Å and less than 60 Å. In an embodiment, the thickness T1 of at least one of the first dielectric layers 210 is greater than 0 Å and less than 10 Å. The thickness T2 of at least one of the second dielectric layers 220 is greater than 0 Å and less than 10 Å.

The bottom electrode BE includes at least one conductive material. In an embodiment, the bottom electrode BE includes at least one of silicon (Si), a metal, such as cobalt, titanium, nickel, tungsten, or molybdenum, a metal nitride, such as titanium nitride (e.g., TiN), titanium silicon nitride (e.g., TiSiN), titanium aluminum nitride (e.g., TiAlN), tantalum nitride (e.g., TaN, TaAlN), or tungsten nitride (e.g., WN), a precious metal, such as platinum (Pt), ruthenium (Ru) or iridium (Ir), a conductive oxide, such as PtO, $RuO_2$, $IrO_2$, SRO ($SrRuO_3$), BSRO (($Ba,Sr)RuO_3$), CRO ($CaRuO_3$), or LSCo, or a metal silicide. The top electrode TE includes at least one of titanium nitride, doped polysilicon, or doped silicon germanium. The top electrode TE may have a single- or multi-layered structure.

In an embodiment, the bottom electrode BE, the dielectric layer 200, and the top electrode TE may be deposited by a chemical vapor deposition method or a physical vapor deposition method. In an embodiment, a deposition temperature of the bottom and top electrodes BE and TE ranges from 450° C. to 700° C., and a deposition temperature of the dielectric layer 200, such as the first and second dielectric layers 210 and 220, is lower than about 400° C. An annealing process is performed on the dielectric layer 200, and a temperature of the annealing process ranges from 200° C. to 700° C.

According to an embodiment of the inventive concept, the dielectric layer 200 includes the first dielectric layers 210 and the second dielectric layers 220 that are alternately stacked in the direction VD. Each of the first dielectric layers 210 and each of the second dielectric layers 220 has thicknesses T1 and T2, respectively, which differ from each other, and an effective dielectric constant of the dielectric layer 200 is adjusted by combining the thicknesses T1 and T2. Thus, an electrostatic capacitance of the capacitor structure CAP can be increased, which increases electric and reliability characteristics of a semiconductor device.

Figure 4:
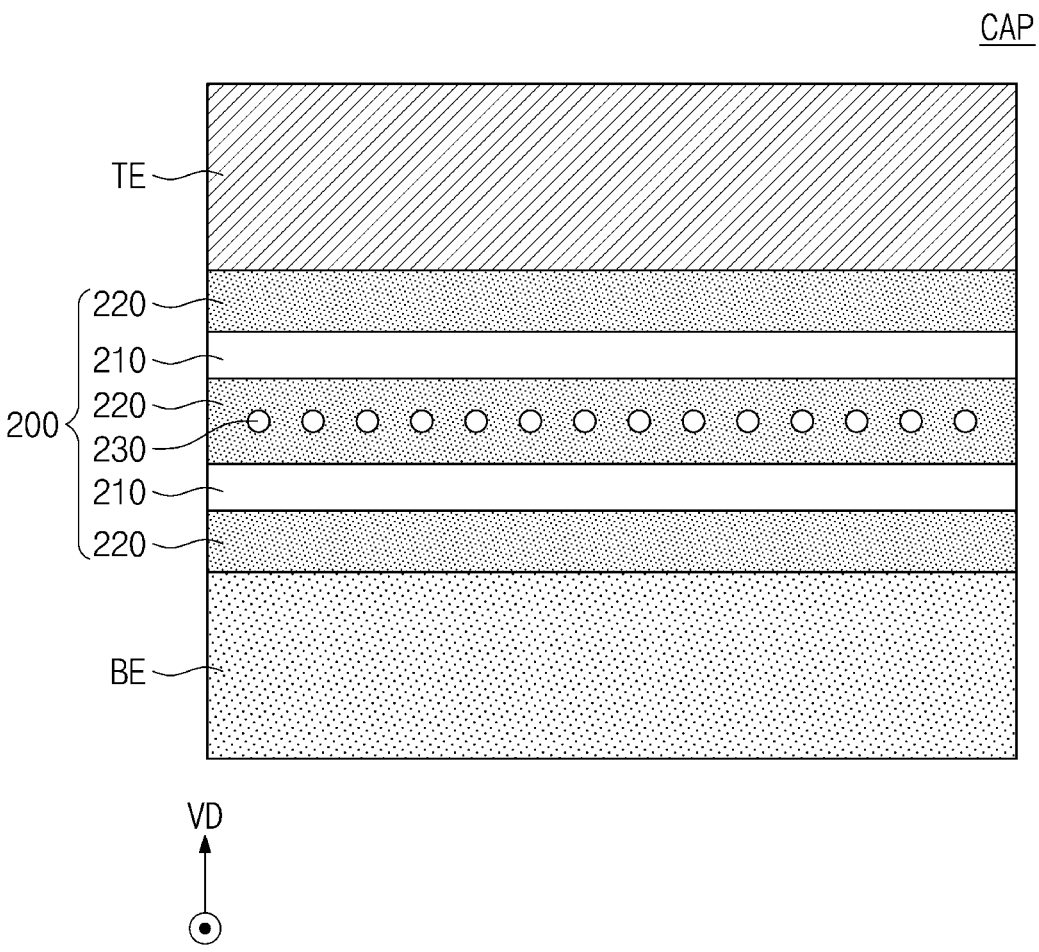
FIGS. 4 and 5 are sectional views of a capacitor structure of a semiconductor device according to an embodiment of the inventive concept.
Figure 5:
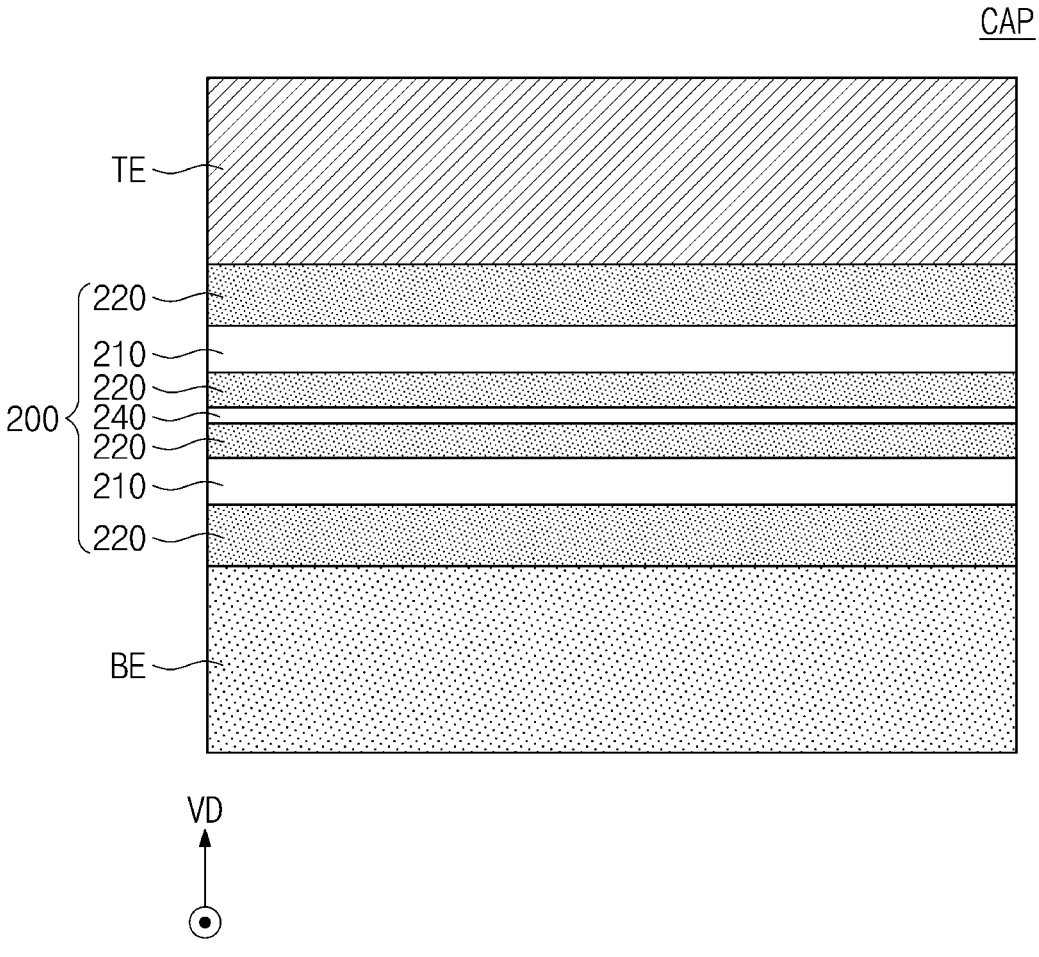

FIGS. 4 and 5 are sectional views of a capacitor structure of a semiconductor device according to an embodiment of the inventive concept. For concise description, a previously described element may be identified by the same reference number without repeating an overlapping description thereof.

Referring to FIG. 4, in an embodiment, the dielectric layer 200 includes an impurity 230. The impurity 230 is doped in at least one of the second dielectric layers 220 of the dielectric layer 200. The doping of the impurity 230 is performed such that the impurity 230 is located near a specific height in the second dielectric layers 220 in the direction VD. For example, when measured in the direction VD, the impurity 230 in the second dielectric layers 220 is located near a height that corresponds to half of a total height of the dielectric layer 200, but embodiments of the inventive concept are not necessarily limited to this example. The impurity 230 includes at least one material that has a band gap greater than 5 eV. For example, the impurity 230 is at least one of aluminum oxide (e.g., $Al_2O_3$), silicon oxide (e.g., $SiO_2$), beryllium oxide (e.g., $BeO_2$), or molybdenum oxide (e.g., $MoO_2$).

Referring to FIG. 5, the dielectric layer 200 includes a third dielectric layer 240. The third dielectric layer 240 is interposed between second dielectric layers 220 that are adjacent to each other in the direction VD. The third dielectric layer 240 includes at least one material that has a band gap greater than 5 eV. In an embodiment, the third dielectric layer 240 includes at least one of aluminum oxide (e.g., $Al_2O_3$), silicon oxide (e.g., $SiO_2$), beryllium oxide (e.g., $BeO_2$), or molybdenum oxide (e.g., $MoO_2$).

Figure 6:
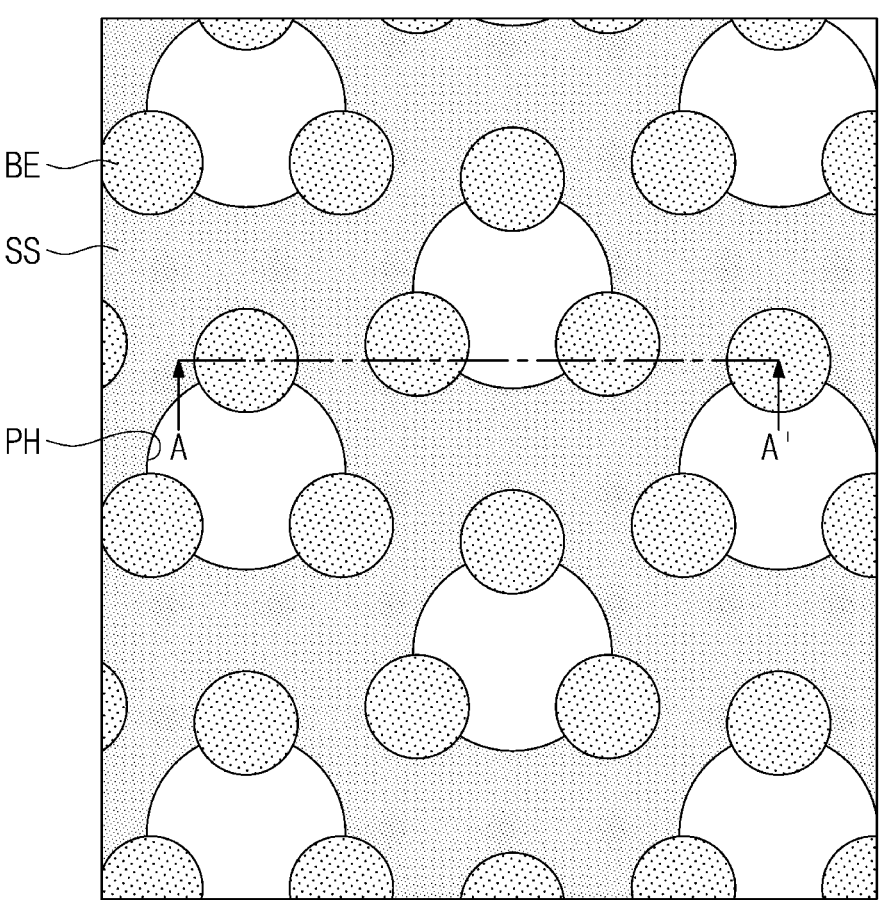
FIG. 6 is a plan view of a semiconductor device according to an embodiment of the inventive concept.
Figure 7:
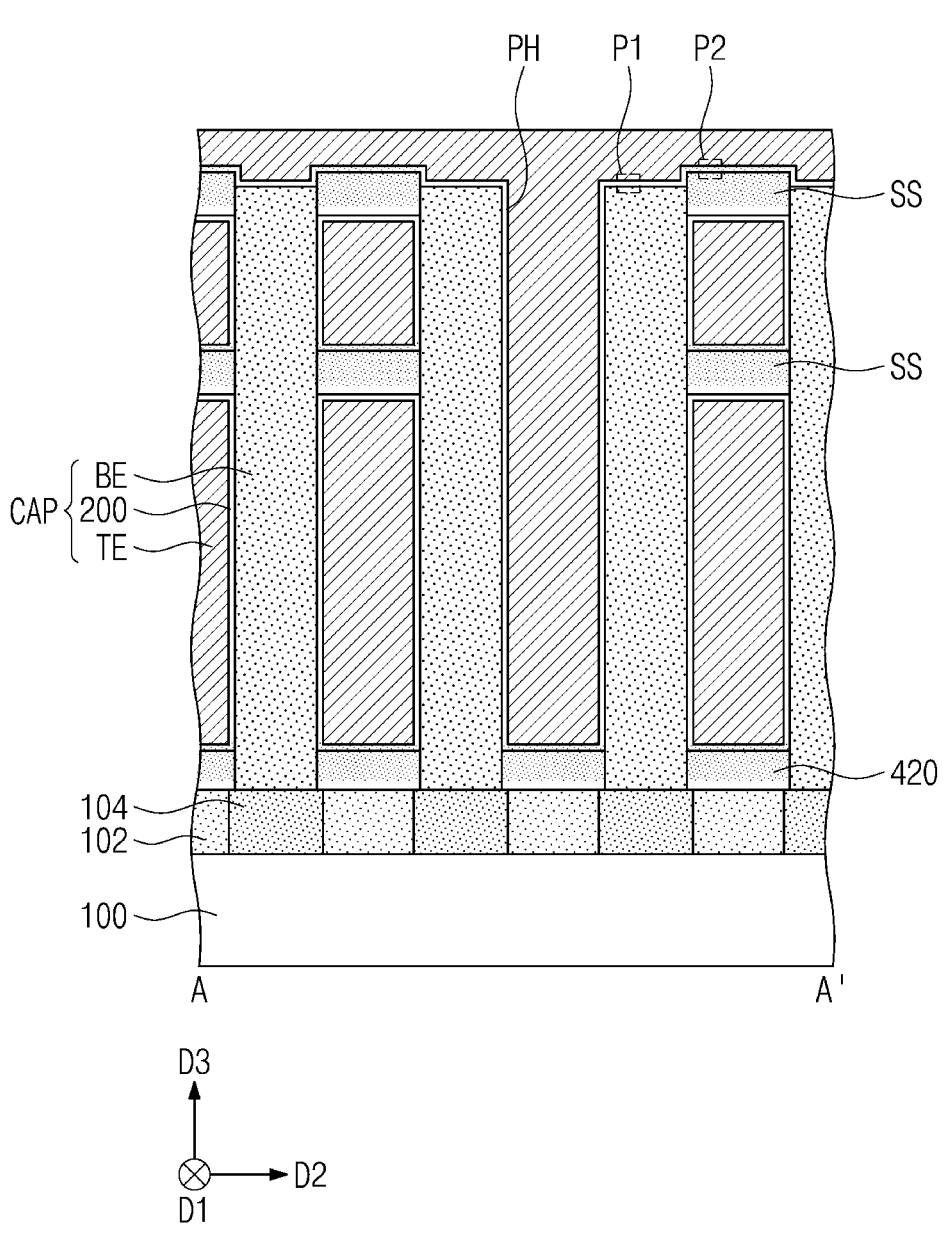
FIG. 7 is a sectional view taken along a line A-A' of FIG. 6.
Figure 8:
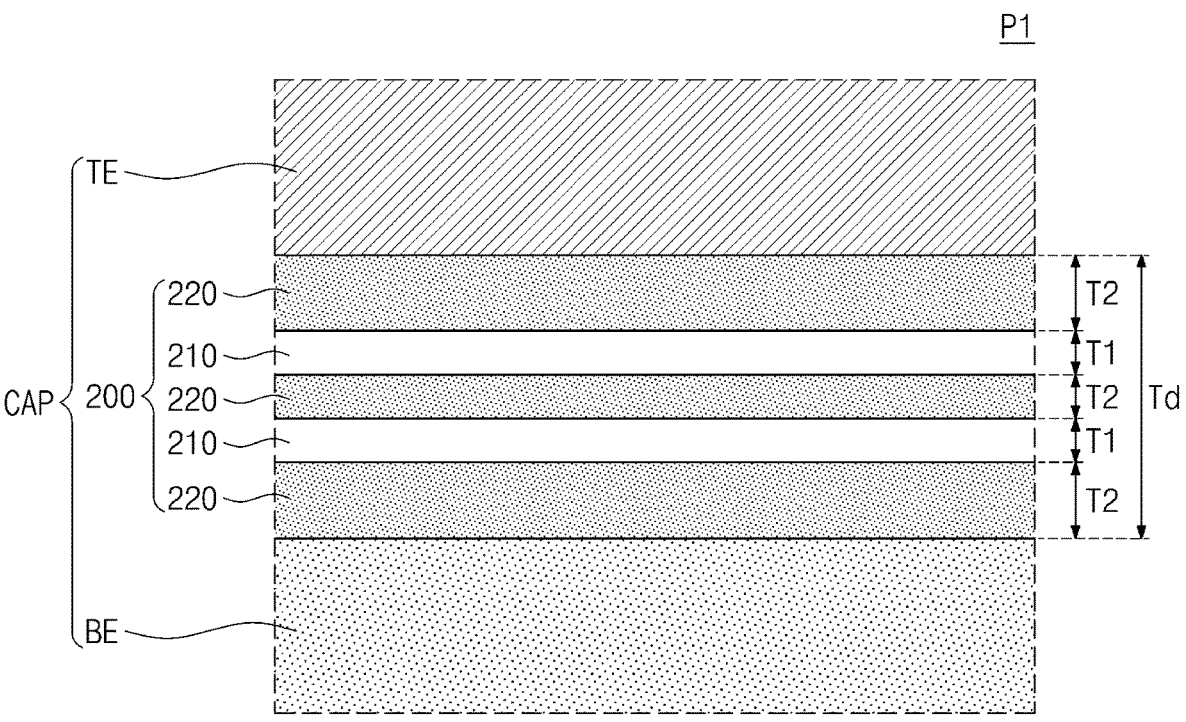
FIGS. 8 and 9 are enlarged views of portions P1 and P2, respectively, of FIG. 7.
Figure 9:
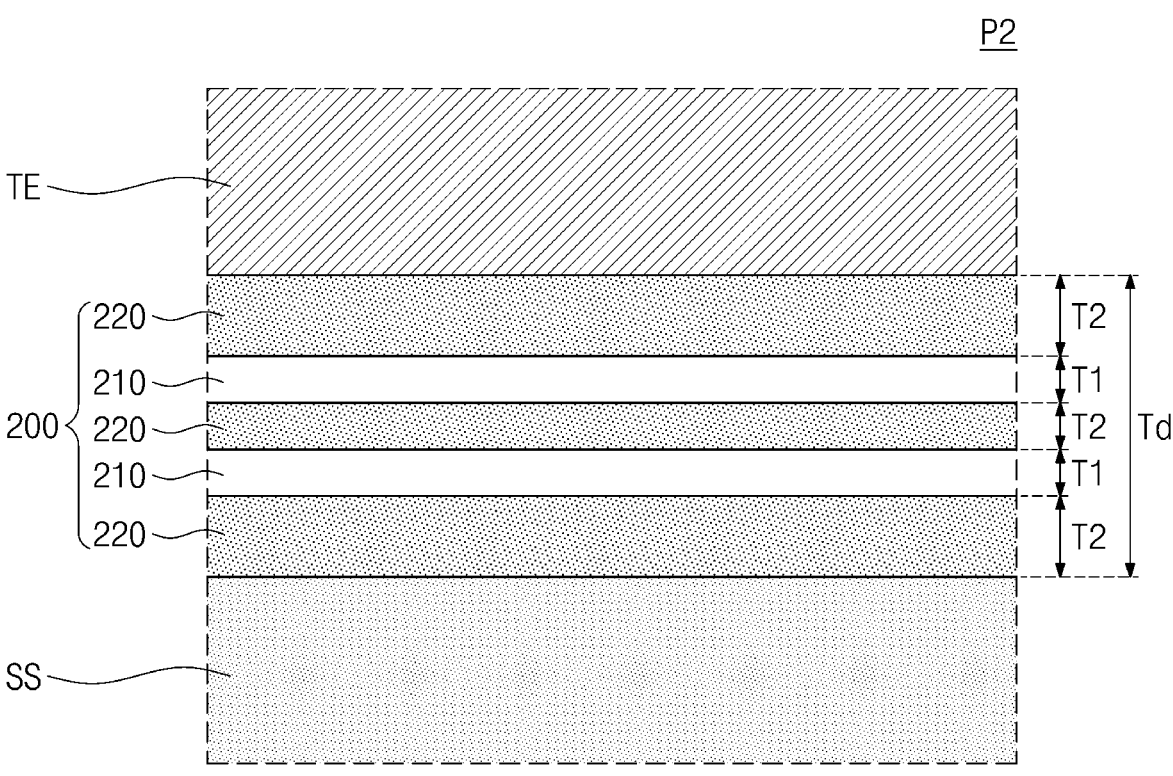

FIG. 6 is a plan view of a semiconductor device according to an embodiment of the inventive concept. FIG. 7 is a sectional view taken along a line A-A' of FIG. 6. FIGS. 8 and 9 are enlarged views of portions P1 and P2, respectively, of FIG. 7. For concise description, a previously described element may be identified by the same reference number without repeating an overlapping description thereof.

Referring to FIGS. 6 to 9, in an embodiment, a substrate 100 is provided. The substrate 100 is a semiconductor substrate. For example, the substrate 100 is one of a silicon substrate, a germanium substrate, or a silicon-germanium substrate.

An interlayer insulating layer 102 is disposed on the substrate 100. The interlayer insulating layer 102 covers at least a portion of a top surface of the substrate 100. In an embodiment, the interlayer insulating layer 102 includes at least one of silicon nitride, silicon oxide, or silicon oxynitride. In an embodiment, the interlayer insulating layer 102 includes an empty region.

A conductive contact 104 is disposed in the interlayer insulating layer 102. In an embodiment, the conductive contact 104 is disposed in the empty region of the interlayer insulating layer 102. In an embodiment, a plurality of conductive contacts 104 are provided that are spaced apart from each other in a first direction D1 and a second direction D2 that are parallel to the top surface of the substrate 100 but are not parallel (e.g., orthogonal) to each other. The conductive contact 104 includes at least one of a doped semiconductor material, such as poly silicon, a metal-semiconductor compound, such as tungsten silicide, a conductive metal nitride, such as titanium nitride, tantalum nitride, or tungsten nitride, or a metal, such as titanium, tungsten, or tantalum. The conductive contact 104 is electrically connected to an impurity region, such as source/drain terminals, formed in the substrate 100.

An etch stop pattern 420 is disposed on the interlayer insulating layer 102. The etch stop pattern 420 covers the interlayer insulating layer 102 and exposes the conductive contacts 104.

The etch stop pattern 420 includes at least one of silicon oxide, SiCN, or SiBN.

Figure 12:
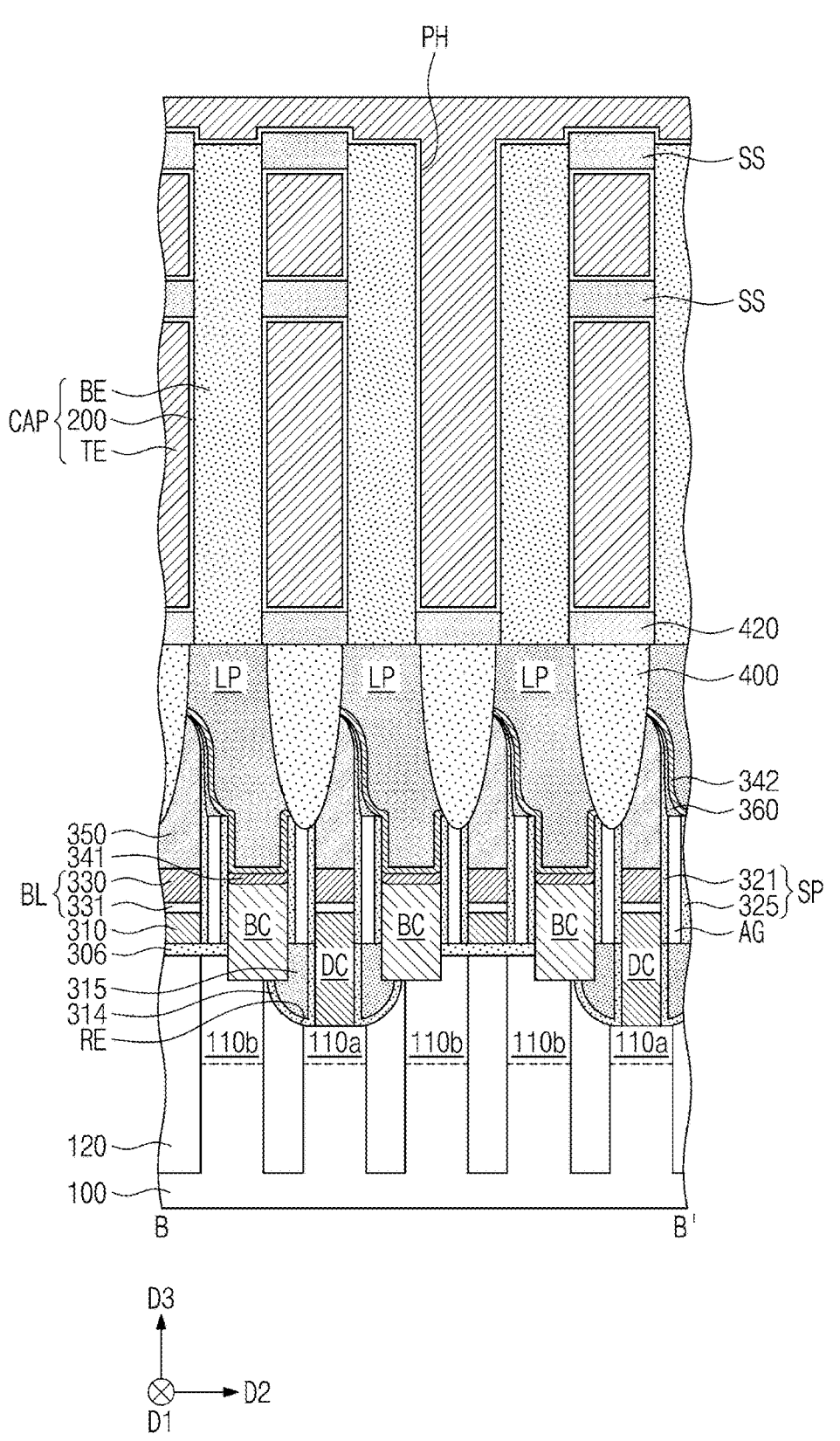
FIG. 12 is a sectional view taken along a line B-B' of FIG. 11.

The bottom electrode BE is disposed on the conductive contact 104. The bottom electrode BE penetrates the etch stop pattern 420 and is electrically connected to the conductive contact 104. In an embodiment, as shown in FIG. 12, the bottom electrode BE has a pillar shape. In addition, in an embodiment, the bottom electrode BE has a hollow cylinder shape with one closed end, such as a cup shape. In another embodiment, the lower portion of the bottom electrode BE has a pillar shape and an upper portion of the bottom electrode BE has a hollow cylinder shape.

A plurality of bottom electrodes BE are provided, and in an embodiment, the bottom electrodes BE are spaced apart from each other in the first and second directions D1 and D2. For example, the bottom electrodes BE are arranged in a honeycomb pattern, when viewed in a plan view. In detail, each of the bottom electrodes BE is placed at the center of a hexagon defined by six other bottom electrodes BE.

The bottom electrode BE includes at least one conductive material. In an embodiment, the bottom electrode BE includes at least one of silicon (Si), a metal, such as cobalt, titanium, nickel, tungsten, or molybdenum, a metal nitride, such as titanium nitride (e.g., TiN), titanium silicon nitride (e.g., TiSiN), titanium aluminum nitride (e.g., TiAlN), tantalum nitride (e.g., TaN, TaAlN), or tungsten nitride (e.g., WN), a precious metal, such as platinum (Pt), ruthenium (Ru) or iridium (Ir), a conductive oxide, such as PtO, $RuO_2$, $IrO_2$, SRO ($SrRuO_3$), BSRO (($Ba,Sr)RuO_3$), CRO ($CaRuO_3$), or LSCo), or a metal silicide.

A supporting pattern SS is disposed on the substrate 100. The supporting pattern SS is provided between adjacent bottom electrodes BE. The supporting pattern SS is in contact with a side surface of the bottom electrode BE and encloses the side surface of the bottom electrode BE. The supporting pattern SS physically supports the bottom electrode BE.

In an embodiment, a plurality of supporting patterns SS are provided, and the supporting patterns SS are spaced apart from each other in a third direction D3 perpendicular to the top surface of the substrate 100. The third direction D3 is normal to a plane defined by the first direction D1 and the second direction D2. The supporting patterns SS have different thicknesses in the third direction D3 from each other. A top surface of the uppermost supporting pattern SS may be located at a height that differs from or is substantially the same as a height of the top surface of the bottom electrode BE. In an embodiment, as shown in FIG. 7, a top surface of the uppermost supporting pattern SS is located at a height that is higher than the top surface of the bottom electrode BE, but embodiments of the inventive concept are not necessarily limited to this example. In an embodiment, the supporting pattern SS includes at least one of silicon nitride, SiBN, or SiCN.

A penetration hole PH is formed between adjacent bottom electrodes BE. For example, each of the penetration holes PH has a circular shape and is formed between three adjacent bottom electrodes BE, and exposes a portion of a side surface of each of the three bottom electrodes BE. However, embodiments of the inventive concept are not necessarily limited to this example, and in an embodiment, the penetration hole PH has various other shapes. The penetration hole PH penetrates the supporting patterns SS. The penetration hole PH exposes the etch stop pattern 420. In an embodiment, a plurality of penetration holes PH are provided that are spaced apart from each other in the first and second directions D1 and D2.

The top electrode TE is disposed on the bottom electrode BE. The top electrode TE covers the bottom electrode BE and the supporting pattern SS. The top electrode TE fills the penetration holes PH and spaces between the bottom electrodes BE, between the supporting patterns SS, and between the lowermost supporting patterns SS and the etch stop pattern 420. The top electrode TE includes at least one of titanium nitride, doped polysilicon, or doped silicon germanium. The top electrode TE may have a single- or multi-layered structure.

The dielectric layer 200 is interposed between each of the bottom electrodes BE and the top electrode TE and extends into a region between the supporting pattern SS and the top electrode TE. The dielectric layer 200 conformally covers the supporting pattern SS, the bottom electrodes BE, and the etch stop pattern 420. The dielectric layer 200, along with the top electrode TE, fill the penetration holes PH.

The dielectric layer 200 includes the first dielectric layers 210 and the second dielectric layers 220. The first and second dielectric layers 210 and 220 are alternately stacked in a direction that is perpendicular to an interface between each of the bottom electrodes BE and the top electrode TE. The first dielectric layers 210 include a ferroelectric material, and the second dielectric layers 220 includes an antiferroelectric material.

The dielectric layer 200 has substantially the same features as the dielectric layer 200 described with reference to FIGS. 1 to 5. For example, as shown in FIGS. 1 to 5 and FIG. 8, the lowermost second dielectric layer 220 is in contact with each of the bottom electrodes BE and is interposed between the lowermost first dielectric layer 210 and each of the bottom electrodes BE. The lowermost first dielectric layer 210 is spaced apart from each of the bottom electrodes BE by the lowermost second dielectric layer 220. The uppermost second dielectric layer 220 is in contact with the top electrode TE and is interposed between the uppermost first dielectric layer 210 and the top electrode TE. The uppermost first dielectric layer 210 is spaced apart from the top electrode TE by the uppermost second dielectric layer 220. The first dielectric layers 210 are interposed between the uppermost second dielectric layer 220 and the lowermost second dielectric layer 220. The number of layers of the first and second dielectric layers 210 and 220 may vary, and number of layers of the second dielectric layers 220 is greater than the number of layers of the first dielectric layers 210.

The first and second dielectric layers 210 and 220 of the dielectric layer 200 extend into a region between the supporting pattern SS and the top electrode TE. Between the supporting pattern SS and the top electrode TE, the first and second dielectric layers 210 and 220 are alternately stacked in a direction that is perpendicular to an interface between the supporting pattern SS and the top electrode TE.

The dielectric layer 200 between the supporting pattern SS and the top electrode TE has substantially the features as the dielectric layer 200 described with reference to FIGS. 1 to 5, except that the bottom electrode BE is replaced by the supporting pattern SS. For example, the lowermost second dielectric layer 220 extends into a region between the supporting pattern SS and the top electrode TE and is in contact with the supporting pattern SS. The uppermost second dielectric layer 220 extends into a region between the supporting pattern SS and the top electrode TE and is in contact with the top electrode TE.

The number of layers of the first dielectric layers 210 that are provided between each of the bottom electrodes BE and the top electrode TE is equal to the number of layers of the first dielectric layers 210 that are provided between the supporting pattern SS and the top electrode TE. The number of layers of the second dielectric layers 220 that are provided between each of the bottom electrodes BE and the top electrode TE is equal to the number of layers of the second dielectric layers 220 that are provided between the supporting pattern SS and the top electrode TE.

The bottom electrode BE, the dielectric layer 200, and the top electrode TE constitute the capacitor structure CAP. For example, the capacitor structure CAP is a data storing element in a semiconductor device according to an embodiment of the inventive concept.

Figure 10:
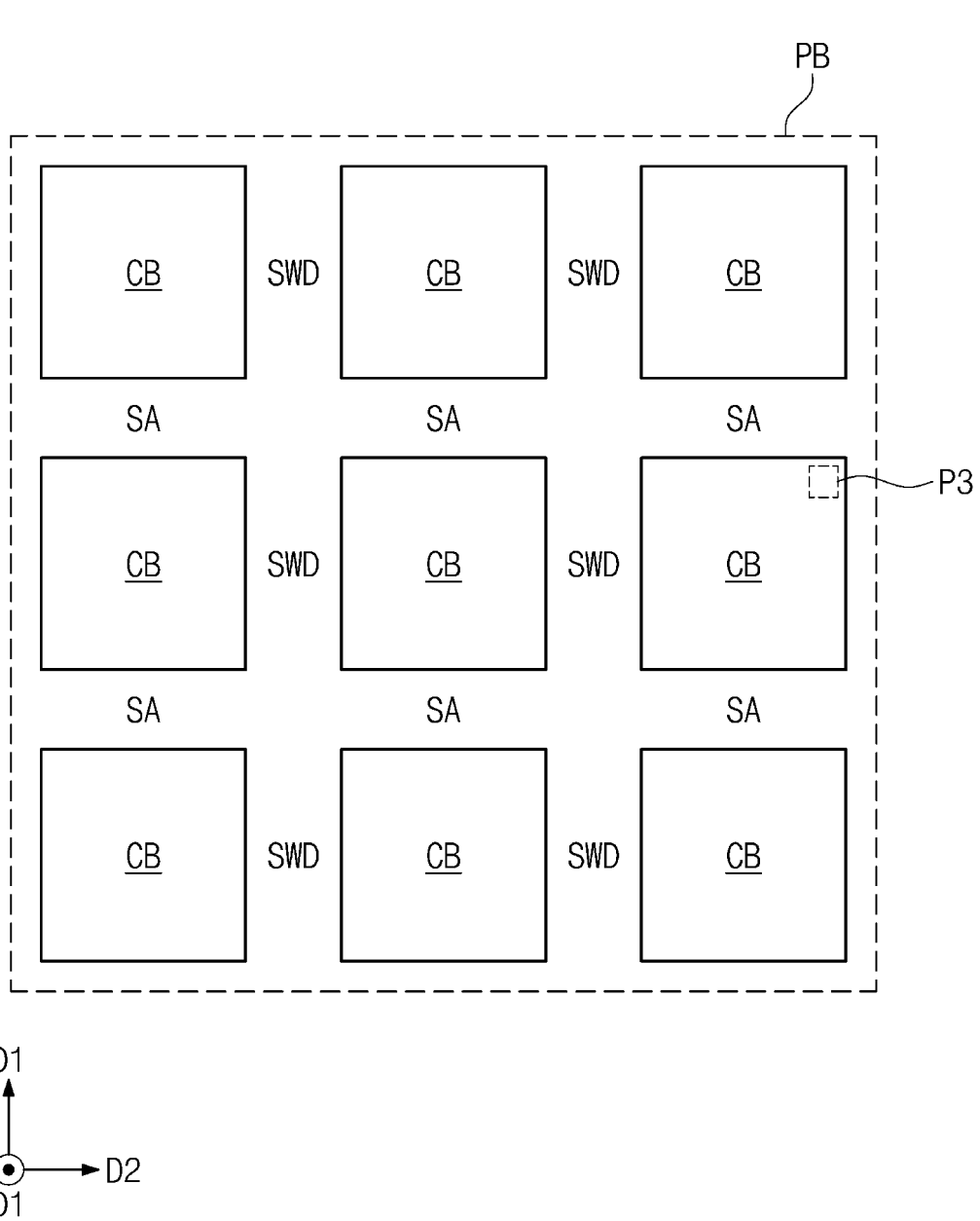
FIG. 10 is a block diagram of a semiconductor device according to an embodiment of the inventive concept.
Figure 11:
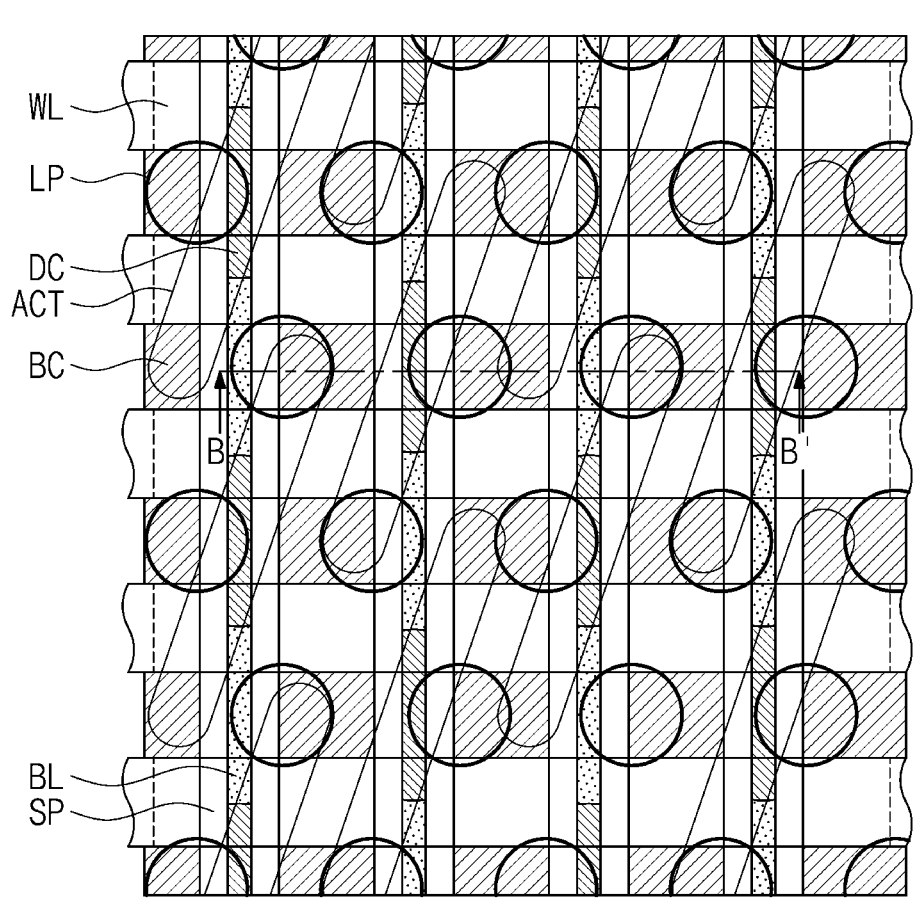
FIG. 11 is an enlarged view of a portion P3 of FIG. 10.
Figure 11:
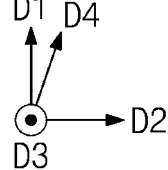

FIG. 10 is a block diagram of a semiconductor device according to an embodiment of the inventive concept. FIG. 11 is an enlarged view of a portion P3 of FIG. 10. FIG. 12 is a sectional view taken along a line B-B' of FIG. 11. For concise description, a previously described element may be identified by the same reference number without repeating an overlapping description thereof.

Referring to FIG. 10, in an embodiment, a semiconductor device includes cell blocks CB and a peripheral block PB that encloses each of the cell blocks CB. The semiconductor device is a memory device, and each of the cell blocks CB includes a cell circuit, such as a memory integrated circuit. The cell blocks CB are spaced apart from each other in the first and second directions D1 and D2.

The peripheral block PB includes various peripheral circuits that are used to operate the cell circuit, and the peripheral circuits are electrically connected to the cell circuit. The peripheral block PB includes sense amplifier circuits SA and sub-word line driver circuits SWD. In an embodiment, the sense amplifier circuits SA face each other with the cell blocks CB interposed therebetween, and the sub-word line driver circuits SWD face each other with the cell blocks CB interposed therebetween. The peripheral block PB further includes power and ground circuits that drive a sense amplifier, but embodiments of the inventive concept are not necessarily limited to this example.

Referring to FIGS. 11 and 12, in an embodiment, the substrate 100 that includes a cell region is provided. The cell region is a region of the substrate 100 in which each cell block CB of FIG. 10 is provided. The substrate 100 is one of a silicon substrate, a germanium substrate, or a silicon-germanium substrate.

Active patterns ACT are disposed on the cell region of the substrate 100. When viewed in a plan view, the active patterns ACT are spaced apart from each other in the first and second directions D1 and D2. In an embodiment, the active patterns ACT have a bar-shape that extends in a fourth direction D4 that is parallel to the top surface of the substrate 100 but not to the first and second directions D1 and D2. An end portion of one of the active patterns ACT is located near a center of another active pattern ACT adjacent thereto in the second direction D2. Each of the active patterns ACT is a protruding portion of the substrate 100 that extends from the substrate 100 in the third direction D3.

Device isolation layers 120 are disposed between the active patterns ACT. The device isolation layers 120 define the active patterns ACT. In an embodiment, the device isolation layers 120 includes at least one of silicon oxide, silicon nitride, and/or silicon oxynitride.

Word lines WL are disposed in the substrate 100 and cross the active patterns ACT and the device isolation layers 120. The word lines WL are disposed in grooves that are formed in the active patterns ACT and the device isolation layers 120. The word lines WL extend in the second direction D2 and are spaced apart from each other in the first direction D1. The word lines WL are buried in the substrate 100.

Impurity regions 110a and 110b are provided in the active patterns ACT. The impurity regions 110a and 110b include first impurity regions 110a and second impurity regions 110b. The second impurity regions 110b are respectively provided in opposite ends of each of the active patterns ACT. Each of the first impurity regions 110a is formed in a portion of the active pattern ACT between the second impurity regions 110b. The first and second impurity regions 110a and 110b contain impurities of the same conductivity type, such as n-type.

A buffer pattern 306 is disposed on the cell region of the substrate 100. The buffer pattern 306 covers the active patterns ACT, the device isolation layers 120, and the word lines WL. In an embodiment, the buffer pattern 306 includes at least one of silicon oxide, silicon nitride, and/or silicon oxynitride.

Bit lines BL are disposed on the substrate 100. The bit lines BL extend in the first direction D1 and are spaced apart from each other in the second direction D2. Each of the bit lines BL includes a first ohmic pattern 331 and a metal-containing pattern 330 that are sequentially stacked. In an embodiment, the first ohmic pattern 331 includes metal silicide. In an embodiment, the metal-containing pattern 330 includes at least one metal, such as tungsten, titanium, or tantalum).

Polysilicon patterns 310 are interposed between the bit lines BL and the buffer pattern 306.

Bit line contacts DC are respectively interposed between the bit lines BL and the first impurity regions 110a. The bit lines BL are electrically connected to the first impurity regions 110a by the bit line contacts DC. The bit line contacts DC include doped or undoped polysilicon.

The bit line contacts DC are disposed in recess regions RE. The recess regions RE are formed in upper portions of the first impurity regions 110a and the device isolation layers 120 that are adjacent to each other. A first gapfill insulating pattern 314 and a second gapfill insulating pattern 315 fill a remaining portion of the recess regions RE.

A bit line capping pattern 350 that extends in the first direction D1 is disposed on each of the bit lines BL. In an embodiment, the bit line capping pattern 350 includes silicon nitride.

A bit line spacer SP is disposed that covers a side surface of each of the polysilicon patterns 310, an upper side surface of each of the bit line contacts DC, a side surface of each of the bit lines BL, and aside surface of the bit line capping pattern 350. The bit line spacer SP extends along each of the bit lines BL and in the first direction D1.

The bit line spacer SP includes a first sub-spacer 321 and a second sub-spacer 325 that are spaced apart from each other. In an embodiment, the first and second sub-spacers 321 and 325 are spaced apart from each other by an air gap AG. The first sub-spacer 321 is in contact with the side surface of each of the bit lines BL and covers the side surface of the bit line capping pattern 350. The second sub-spacer 325 is provided along a side surface of the first sub-spacer 321. The first and second sub-spacers 321 and 325 include at least one of silicon nitride, silicon oxide, or silicon oxynitride, and may have a single- or multi-layered structure. The first and second sub-spacers 321 and 325 include the same material.

An upper spacer 360 covers the side surface of the first sub-spacer 321 and extends to a region on a top surface of the second sub-spacer 325. The upper spacer 360 covers or stops the air gap AG.

Storage node contacts BC are disposed on the substrate 100 and are interposed between adjacent bit lines BL. The bit line spacer SP is interposed between the storage node contacts BC and the bit lines BL adjacent thereto. The storage node contacts BC are spaced apart from each other in the first and second directions D1 and D2. Each of the storage node contacts BC is electrically connected to a corresponding second impurity region 110b. The storage node contacts BC include doped or undoped polysilicon.

Second ohmic patterns 341 are disposed on the storage node contacts BC. The second ohmic pattern 341 include at least one metal silicide.

A diffusion-prevention pattern 342 is disposed that conformally covers the second ohmic pattern 341, the bit line spacer SP, and the bit line capping pattern 350. The diffusion-prevention pattern 342 includes at least one metal nitride, such as titanium nitride or tantalum nitride. The second ohmic pattern 341 is interposed between the diffusion-prevention pattern 342 and each of the storage node contacts BC.

Landing pads LP are disposed on the storage node contacts BC. Each of the landing pads LP is electrically connected to a corresponding storage node contact BC. The landing pads LP include at least one metal-containing material, such as tungsten. An upper portion of the landing pad LP is displaced from the storage node contact BC in the second direction D2. When viewed in a plan view, the landing pads LP are spaced apart from each other in the first and second directions D1 and D2. For example, the landing pads LP are spaced apart from each other in the first and second directions D1 and D2 or are arranged in a zigzag pattern. Each of the landing pads LP corresponds to a conductive contact 104 of FIG. 7.

A filling pattern 400 encloses each of the landing pads LP. The filling pattern 400 is interposed between adjacent landing pads LP. In an embodiment, the filling pattern 400 includes at least one of silicon nitride, silicon oxide, or silicon oxynitride. In an embodiment, the filling pattern 400 includes an empty region. The filling pattern 400 corresponds to the interlayer insulating layer 102 of FIG. 7.

The etch stop pattern 420 is disposed on the filling pattern 400. The etch stop pattern 420 exposes top surfaces of the landing pads LP.

The bottom electrode BE is disposed on the landing pads LP. In an embodiment, a plurality of bottom electrodes BE are provided, and each bottom electrode BE is disposed on a corresponding landing pad LP. The bottom electrode BE are electrically connected to the corresponding landing pads LP.

The supporting pattern SS is disposed on the substrate 100. The supporting pattern SS is interposed between adjacent bottom electrodes BE. The supporting pattern SS corresponds to the supporting pattern SS described with reference to FIGS. 6 to 9.

The top electrode TE covers the bottom electrode BE and the supporting pattern SS. The dielectric layer 200 is interposed between the bottom electrode BE and the top electrode TE and extends into a region between the supporting pattern SS and the top electrode TE. The bottom electrode BE, the dielectric layer 200, and the top electrode TE constitute the capacitor structure CAP. The capacitor structure CAP corresponds to the capacitor structure CAP of a semiconductor device described above. For example, the bottom electrode BE, the dielectric layer 200, and the top electrode TE have the same features as those in a previous embodiment.

According to an embodiment of the inventive concept, a dielectric layer of a capacitor structure of a semiconductor device includes first dielectric layers and second dielectric layers that are alternately stacked in a first direction. Each of the first dielectric layers and each of the second dielectric layers have thicknesses that differ from each other, and an effective dielectric constant of the dielectric layer is adjusted by combining the thicknesses of the first and second dielectric layers. Thus, an electrostatic capacitance of the capacitor structure can be increased, which increases the electric and reliability characteristics of a semiconductor device.

While embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
a capacitor structure,
wherein the capacitor structure comprises a bottom electrode, a dielectric layer, and a top electrode that are sequentially stacked in a first direction,
wherein the dielectric layer comprises a plurality of first dielectric layers and a plurality of second dielectric layers interposed between the bottom electrode and the top electrode, which are alternately stacked in the first direction,
wherein the plurality of first dielectric layers comprise a ferroelectric material,
wherein the plurality of second dielectric layers comprise an anti-ferroelectric material,
wherein a lowermost second dielectric layer is interposed between a lowermost first dielectric layer and the bottom electrode,
wherein an uppermost second dielectric layer is interposed between an uppermost first dielectric layer and the top electrode, and
wherein a thickness of each of the plurality of first dielectric layers differs from a thickness of each of the plurality of second dielectric layers.

2. The semiconductor device of claim 1, wherein a total thickness in the first direction of the dielectric layer is less than or equal to 60 Å.

3. The semiconductor device of claim 1, wherein thicknesses in the first direction of the plurality of first dielectric layers are different from each other.

4. The semiconductor device of claim 1, wherein a thickness in the first direction of each of the plurality of first dielectric layers is less than or equal to 10 Å.

5. The semiconductor device of claim 1, wherein a sum of thicknesses in the first direction of the plurality of first dielectric layers is less than or equal to 30% of a total thickness in the first direction of the dielectric layer.

6. The semiconductor device of claim 1, wherein a thickness in the first direction of at least one of the plurality of second dielectric layers is less than or equal to 10 Å.

7. The semiconductor device of claim 1, wherein a number of layers of the plurality of second dielectric layers is less than a number of layers of the plurality of first dielectric layers.

8. The semiconductor device of claim 1, wherein
the lowermost second dielectric layer is in contact with the bottom electrode, and
the uppermost second dielectric layer is in contact with the top electrode.

9. The semiconductor device of claim 1, further comprising an impurity provided in at least one of the plurality of second dielectric layers.

10. The semiconductor device of claim 9, wherein the impurity comprises a material that has a band gap that is less than or equal to 5 eV.

11. A semiconductor device, comprising:
a capacitor structure,
wherein the capacitor structure comprises a bottom electrode, a dielectric layer, and a top electrode that are alternately stacked in a first direction,
wherein the dielectric layer comprises a plurality of first dielectric layers and a plurality of second dielectric layers interposed between the bottom electrode and the top electrode, which are alternately stacked in the first direction,
wherein the plurality of first dielectric layers comprise a ferroelectric material,
wherein the plurality of second dielectric layers comprise an anti-ferroelectric material,
wherein a lowermost second dielectric layer is in contact with the bottom electrode,
wherein an uppermost second dielectric layer is in contact with the top electrode,
wherein the plurality of first dielectric layers are interposed between the uppermost and the lowermost second dielectric layers, and
wherein a thickness of each of the plurality of first dielectric layers differs from a thickness of each of the plurality of second dielectric layers.

12. The semiconductor device of claim 11, wherein a total thickness in the first direction of the dielectric layer is less than or equal to 60 Å.

13. The semiconductor device of claim 11, wherein a thickness in the first direction of each of the plurality of first dielectric layers is less than or equal to 10 Å.

14. The semiconductor device of claim 11, wherein a sum of thicknesses in the first direction of the plurality of first dielectric layers is less than or equal to 30% of a total thickness in the first direction of the dielectric layer.

15. The semiconductor device of claim 11, further comprising an impurity provided in at least one of the plurality of second dielectric layers.

16. A semiconductor device, comprising:
a substrate;
bottom electrodes disposed on the substrate and that are horizontally spaced apart from each other;
a top electrode that covers the bottom electrodes; and
a dielectric layer interposed between each of the bottom electrodes and the top electrode,
wherein the dielectric layer comprises a plurality of first dielectric layers and a plurality of second dielectric layers, which are alternately stacked in a direction perpendicular to an interface between each of the bottom electrodes and the top electrode,
wherein the plurality of first dielectric layers comprise a ferroelectric material,
wherein the plurality of second dielectric layers comprise an anti-ferroelectric material,
wherein a lowermost second dielectric layer is interposed between a lowermost first dielectric layer and each of the bottom electrodes,
wherein an uppermost second dielectric layer is interposed between an uppermost first dielectric layer and the top electrode, and
wherein a thickness of each of the plurality of first dielectric layers differs from a thickness of each of the plurality of second dielectric layers.

17. The semiconductor device of claim 16, wherein
the lowermost second dielectric layer is in contact with each of the bottom electrodes, and
the uppermost second dielectric layer is in contact with the top electrode.

18. The semiconductor device of claim 16, further comprising a supporting pattern interposed between the bottom electrodes,
wherein the plurality of first dielectric layers and the plurality of second dielectric layers extend into regions between the supporting pattern and the top electrode, and
the plurality of first dielectric layers and the plurality of second dielectric layers located between the supporting pattern and the top electrode are alternately stacked in a direction perpendicular to an interface between the supporting pattern and the top electrode.

19. The semiconductor device of claim 18, wherein a lowermost second dielectric layer extends into a region between the supporting pattern and the top electrode and is in contact with the supporting pattern.

20. The semiconductor device of claim 18, wherein a number of layers of the plurality of first dielectric layers interposed between each of the bottom electrodes and the top electrode is equal to a number of layers of the plurality of first dielectric layers interposed between the supporting pattern and the top electrode, and
a number of layers of the plurality of second dielectric layers interposed between each of the bottom electrodes and the top electrode is equal to a number of layers of the plurality of second dielectric layers interposed between the supporting pattern and the top electrode.

* * * * *